(12) United States Patent
Zhao (10) Patent No.: US 7,262,622 B2
(45) Date of Patent: Aug. 28, 2007

(54) WAFER-LEVEL PACKAGE FOR INTEGRATED CIRCUITS

(75) Inventor: Yang Zhao, Andover, MA (US)

(73) Assignee: Memsic, Inc., North Andover, MA (US)

( * ) Notice: Subject to any disclaimer, the term of this patent is extended or adjusted under 35 U.S.C. 154(b) by 95 days.

(21) Appl. No.: 11/088,633

(22) Filed: Mar. 24, 2005

(65) Prior Publication Data

US 2006/0216856 A1 Sep. 28, 2006

(51) Int. Cl.
*G01R 31/02* (2006.01)
*G01R 31/26* (2006.01)

(52) U.S. Cl. ...................... 324/763; 324/765

(58) Field of Classification Search ............ None
See application file for complete search history.

(56) References Cited

U.S. PATENT DOCUMENTS

| | | | |
|---|---|---|---|
| 6,291,884 B1 * | 9/2001 | Glenn et al. ............. | 257/747 |
| 6,656,827 B1 * | 12/2003 | Tsao et al. ............... | 438/612 |
| 6,786,654 B2 | 9/2004 | Kilian ...................... | 385/94 |
| 6,818,464 B2 | 11/2004 | Heschel ................... | 438/22 |
| 6,832,013 B1 | 12/2004 | Kuhmann et al. ......... | 385/14 |
| 6,856,717 B2 | 2/2005 | Kilian ...................... | 385/15 |
| 6,882,045 B2 * | 4/2005 | Massingill et al. ...... | 257/724 |
| 6,900,532 B1 | 5/2005 | Kelkar et al. ............ | 257/698 |
| 7,115,997 B2 * | 10/2006 | Narayan et al. ......... | 257/769 |
| 2004/0266038 A1 | 12/2004 | Heschel .................... | 438/22 |
| 2005/0059204 A1 | 3/2005 | Heschel .................... | 438/222 |

OTHER PUBLICATIONS

Accuratus, Macor Machinable Glass Ceramic Frit Sealing, http://www.accuratus.com/macorfab4.html (2002).
Intel Technology Journal "Optical Technologies and Applications," vol. 08/02 ISSN 1535-864X, http::www.intel.com/technology/itj/2004/volume08issue02/art04_interconnect/p04_siliconoptical.htm (May 10, 2004).
Mirza et al., Silicon Wafer Bonding: Key to MEMS High-Volume Manufacturing, Allegro Micro Systems, Inc. http://www.sensormag.com/articles/1298/sill298/main.shtml, pp. 1-11 (Dec. 1998).
L. Nguyen, "Wafer Level Packaging," National Semiconductor Corp., Santa Clara, CA IEEE CPMT Meeting, pp. 1-27 (Feb. 2002).
Sparks et al., "Reliable Vacuum Packaging Using NanoGetters™ and Glass Frit Bonding," Proc. SPIE vol. 5343, (Jan. 2004).

(Continued)

*Primary Examiner*—Jermele Hollington
(74) *Attorney, Agent, or Firm*—Weingarten, Schurgin, Gagnebin & Lebovici LLP (57) ABSTRACT

A wafer-level packaged IC is made by attaching a cap wafer to the top of an IC wafer before cutting the IC wafer, i.e. before singulating the plurality of die on the IC wafer. The cap wafer is mechanically attached and electrically connected to the IC wafer, then the die are singulated. Electrically conductive paths extend through the cap wafer, between wafer contact pads on the top surface of the cap and electrical contact points on the IC wafer. Optionally, the cap wafer contains one or more die. The IC wafer can be fabricated according to a different technology than the cap wafer, thereby forming a hybrid wafer-level package. Optionally, additional "upper-level" cap wafers (with or without die) can be stacked to form a "multi-story" IC.

33 Claims, 10 Drawing Sheets

OTHER PUBLICATIONS

Sridharan et al., "Post-Packaging Release: A New Concept for Surface-Micromachined Devices,", Tech. Dig., Solid-State Sensor and Actuator Workshop, Hilton Head Island, SC (Jun. 1998) pp. 225-228.

Hymite, Presentation Outline HyCap®, The MEMS Packaging Revolution (Nov. 2004).

Cluff et al., 10A.1 Electronic Packaging Technologies, CRC Press LLC (2001).

* cited by examiner

WAFER-LEVEL PACKAGE FOR INTEGRATED CIRCUITS

CROSS REFERENCE TO RELATED APPLICATIONS (Not applicable)

STATEMENT REGARDING FEDERALLY SPONSORED RESEARCH OR DEVELOPMENT (Not applicable)

BACKGROUND OF THE INVENTION

The present invention relates to integrated circuit packages and, more particularly, to wafer-level packages for integrated circuits. Integrated circuits (ICs) are manufactured as wafers, each wafer containing many individual circuits (die). After fabrication, a wafer is cut ("singulated") into individual die. Each die is then encapsulated in a plastic or ceramic package or is attached to a ceramic cap.

Each die includes several electrical contact pads. During packaging, each of these contact pads is connected to a respective lead or another external structure. In one common practice, a bonding wire is welded between each contact pad and a respective lead. The leads or other structures are used to electrically connect a completed IC to a circuit board or the like, such as by soldering. These solder connections often also provide the sole mechanical connection between the IC and the circuit board.

IC wafer fabrication is commonly referred to as the "front-end" process of IC fabrication. An IC wafer can be fabricated relatively efficiently, because all die on the wafer are fabricated concurrently (i.e., in parallel), such as by a photolithographic process, in which an entire layer of the wafer is produced at one time using a lithographic mask. Thus, the amount of time required to fabricate a wafer is largely independent of the number of die on the wafer. However, after the die are singulated, packaging the individual die (the "back-end" process of IC fabrication) is time consuming and expensive, because each die must be packaged individually (i.e., serially). Given the reliance of the electronics industry on ICs and the large number of ICs installed every week, reducing the cost of each IC can lead to a substantial overall cost saving.

BRIEF SUMMARY OF THE INVENTION

The present invention provides a method of wafer-level packaging (WLP) integrated circuits (ICs). Embodiments of the invention include the resulting wafer-level packed ICs and chip-scale packaged (CSP) ICs. The invention also provides methods for fabricating wafer-level packaged hybrid ICs and their components modules, and embodiments of the invention include such hybrid ICs and their components. The invention eliminates the traditional back-end process and extends traditional multi-chip hybrid packaging to wafer-level and to chip-scale modules, which provide integration through chip bonding.

A wafer-level packaged IC is made by attaching a cap wafer to an IC wafer before cutting the IC wafer, i.e. before singulating the plurality of die on the IC wafer. The cap wafer is overlaid over some or all of the die on the IC wafer, then the cap wafer is mechanically attached and electrically connected to the IC wafer. The cap wafer can comprise plain (i.e., without any IC circuitry) silicon or other material, or the cap wafer can contain IC circuitry, which can be electrically connected to the die on the IC wafer. Advantageously, the IC wafer can be fabricated according to a different technology than the cap wafer, thereby forming a hybrid wafer-level package. After the cap wafer is mechanically attached and electrically connected to the IC wafer, the cap wafer and the IC wafer are cut, yielding singulated, packaged ICs that can be soldered or otherwise mounted to circuit boards. Alternatively, the cap wafer is cut without cutting the IC wafer, to facilitate attaching an additional ("upper-story") one or more caps (with or without die) to form a "multi-story" IC.

Thus, all the die on the IC wafer can be packaged in a single operation, and then the packaged die are singulated, significantly reducing the time and cost to package the die. These and other features, advantages, aspects and embodiments of the present invention will become more apparent to those skilled in the art from the Detailed Description of the Invention that follows.

BRIEF DESCRIPTION OF THE SEVERAL VIEWS OF THE DRAWINGS

The invention will be more fully understood by referring to the Detailed Description of the Invention in conjunction with the Drawings, of which.

DETAILED DESCRIPTION OF THE INVENTION

Embodiments of the present invention include wafer-level packages for integrated circuits (ICs), as well as methods for fabricating wafer-level packaged ICs and their components. A wafer-level packaged IC is made by attaching a semiconductor cap wafer to an IC wafer before cutting the IC wafer, i.e. before singulating the plurality of die on the IC wafer. The cap wafer is overlaid over some or all of the die on the IC wafer, then the cap wafer is mechanically attached to the IC wafer. For example, the wafers can be attached to each other by solder at various counterfacing locations on the cap wafer and on the IC wafer in the vicinity of each die. Each die is sealed between the cap wafer and the IC wafer, such as to prevent infiltration of moisture. The seal can be provided by the mechanical attachment between the cap wafer and the IC wafer, or the seal and the mechanical attachment can be provided by separate elements.

The IC wafer contains at least one electrical contact point proximate to, and associated with, each die. For example, according to conventional IC packaging practices, bonding wires might be welded to these contact points. On the side of the cap wafer away from the die (the "front side" of the cap wafer), the cap wafer contains electrical contact pads corresponding to at least some of the die electrical contact points. Electrically conductive material extends from these cap wafer contact pads, through the cap wafer, and is electrically connected on the other side of the cap wafer (the "back side" of the cap wafer) to respective electrical contact points on the IC wafer. Preferably, the electrical connections between the cap wafer and the IC wafer also provide the mechanical attachment of the cap wafer to the IC wafer, although the electrical connections and the mechanical attachments can be provided by separate elements.

Optionally, the cap wafer contains one or more die, which can be electrically connected to the die on the IC wafer, such as by some of the contact pad extensions. Advantageously, the IC wafer can be fabricated according to a different technology than the cap wafer, thereby forming a hybrid wafer-level package. For example, one wafer can be fabricated using silicon (Si), gallium arsenide (GaAs), gallium nitride (GaN) or any other suitable material, and the other wafer can be fabricated using another of these or other materials.

After the cap wafer is mechanically attached and electrically connected to the IC wafer, the cap wafer and the IC wafer are cut, yielding singulated, packaged ICs that can be soldered or otherwise mounted to circuit boards. Alternatively, the cap wafer is cut without cutting the IC wafer, to facilitate attaching an additional ("upper-story") one or more caps (with or without die) to form a "multi-story" IC. In this case, the IC wafer is cut at the same time as or after the top level cap is cut. Each layer of such a multi-story IC can be fabricated according to a different technology. Optionally, several die on a single IC wafer are covered by a single cap wafer to form a horizontal group of die under a single cap.

Figure 7:
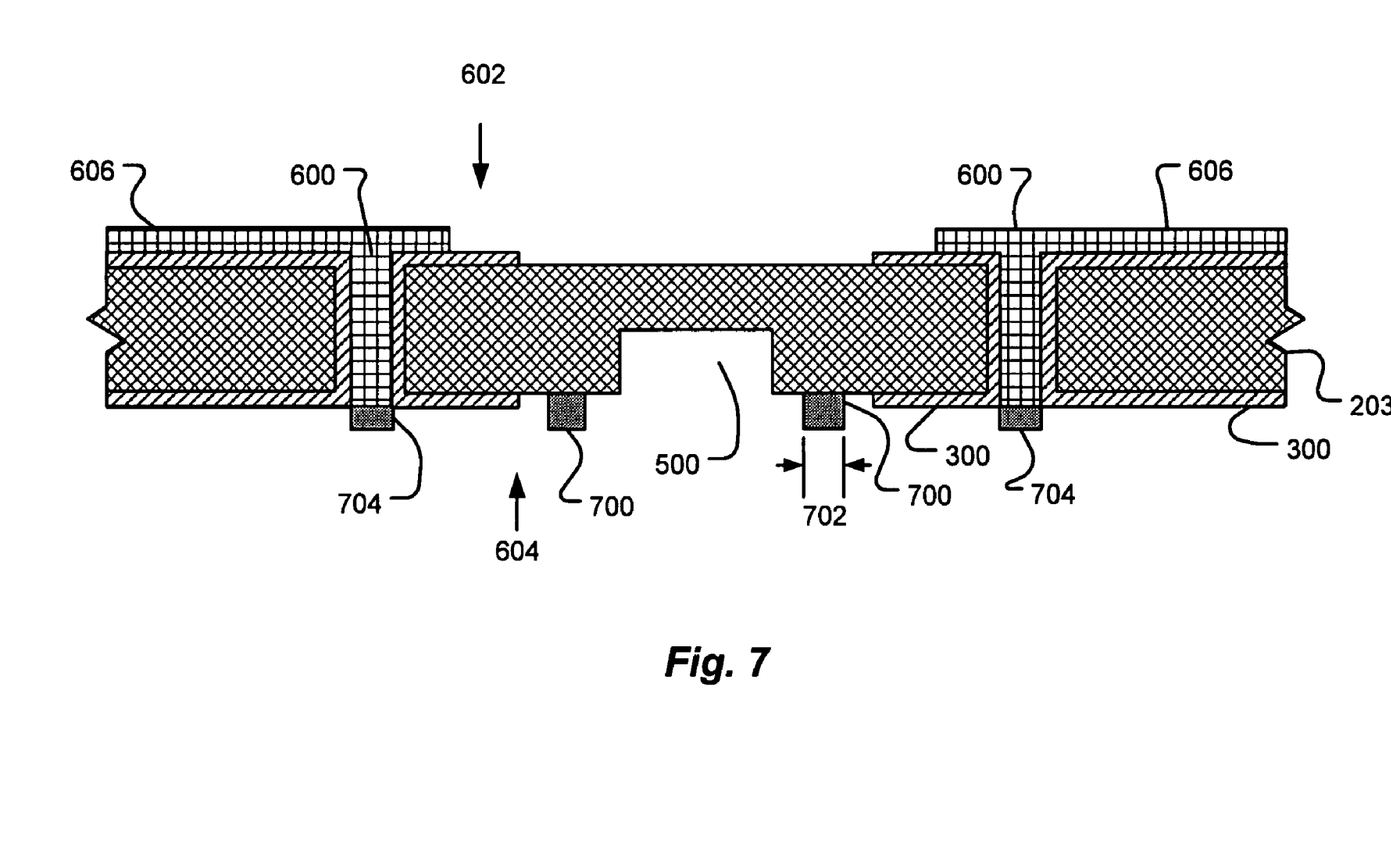
Figure 8:
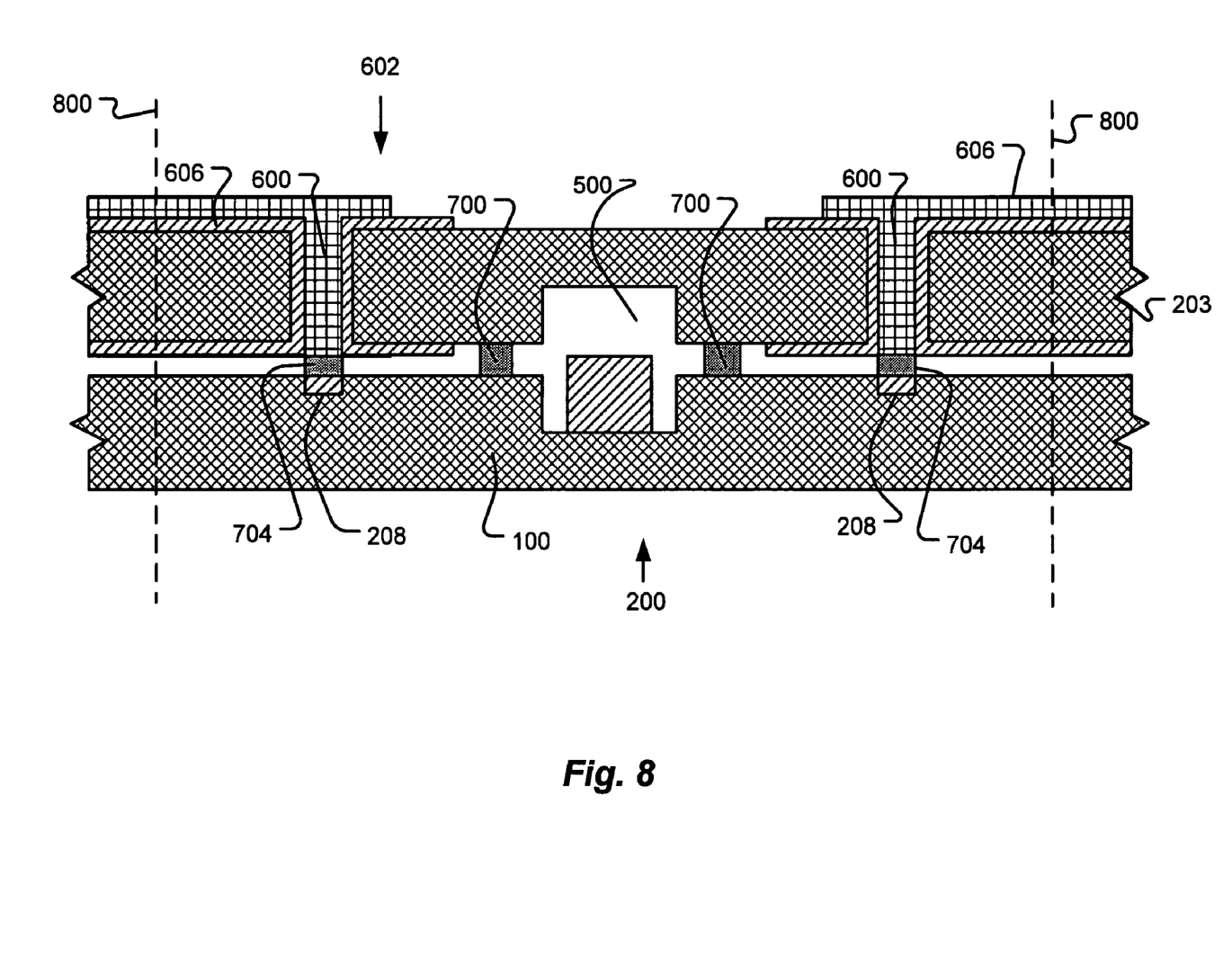
Figure 9:
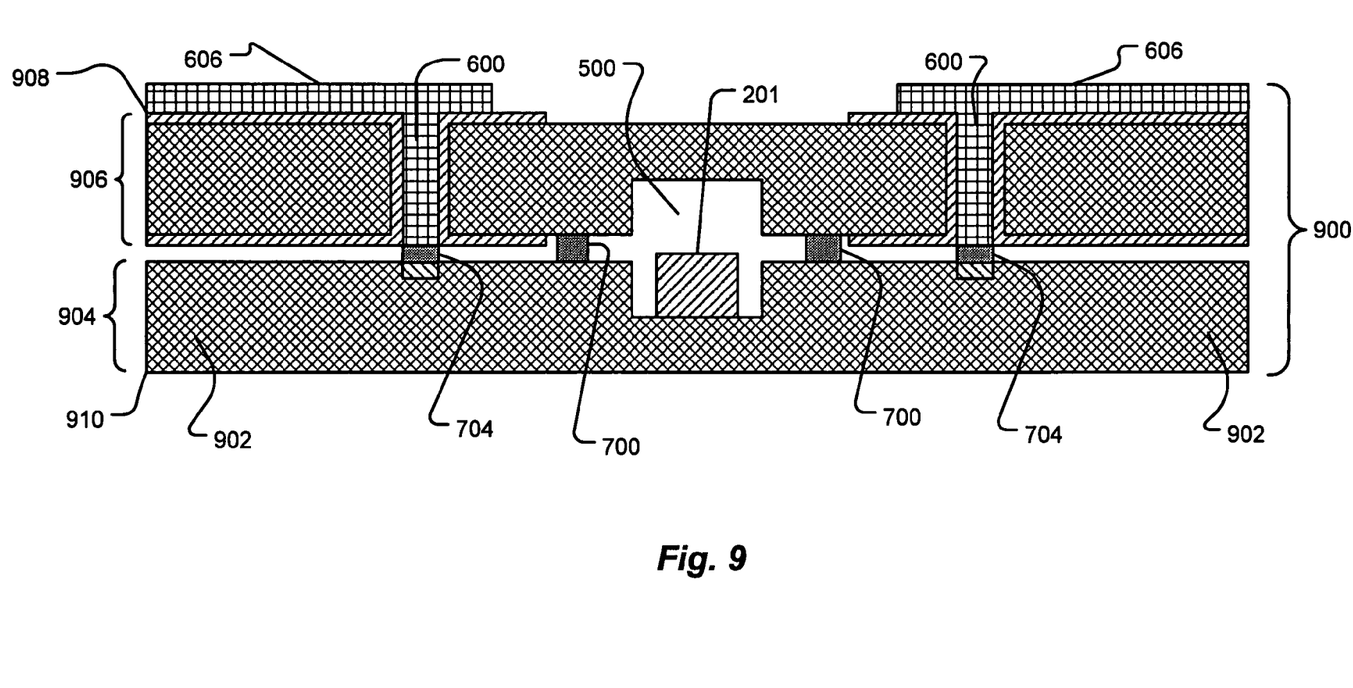
FIG. 9 is a cross-sectional diagram of a completed wafer-level packaged IC, in accordance with one embodiment of the present invention.
Figure 10:
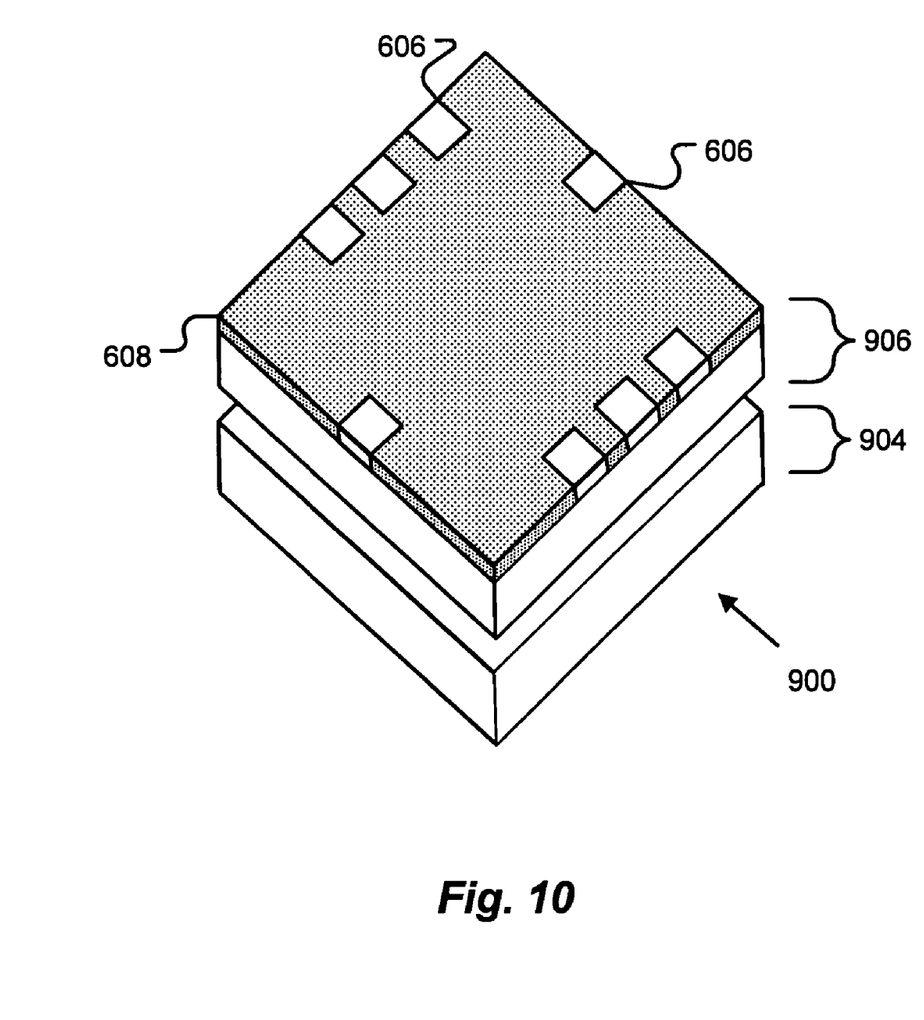
FIG. 10 is an isometric view of the wafer-level packaged IC of FIG. 9.

FIGS. 2-8 illustrate intermediate stages during fabrication of a wafer-level packaged IC, according to one embodiment of the present invention. FIGS. 9 and 10 illustrate a completed wafer-level packaged IC that may be a product of the stages shown in FIGS. 2-8.

Figure 1A:
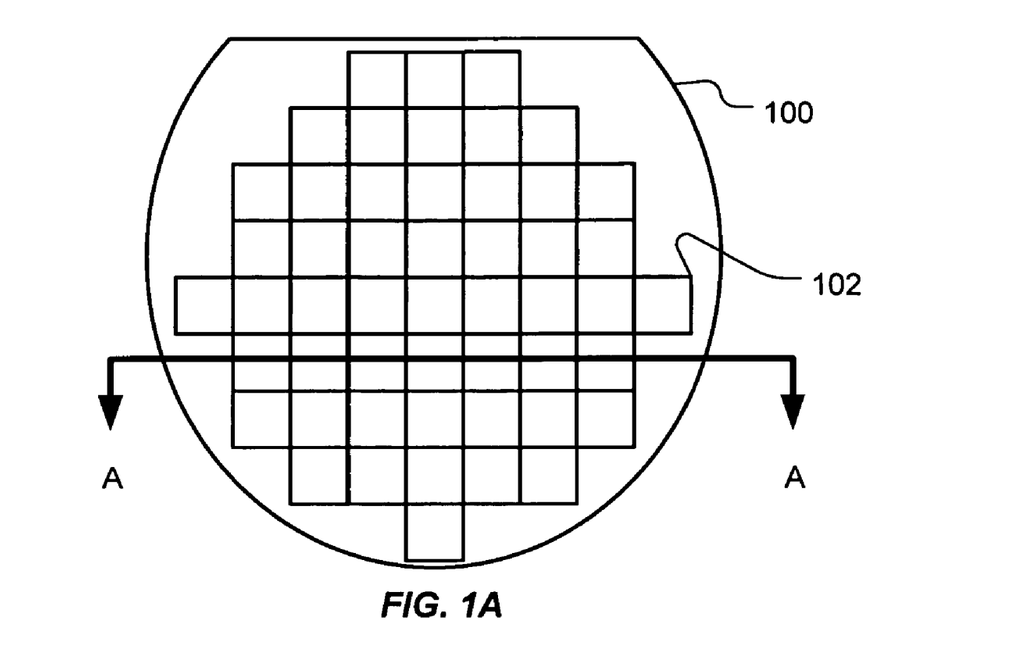
FIG. 1a is a top view diagram of an integrated circuit (IC) wafer, in accordance with one embodiment of the present invention.

FIG. 1a is a top view of an IC wafer 100 containing a plurality of die, such as die 102. Die 102 can contain a digital or analog electronic component or circuit (such as a light-emitting diode (LED), photo-sensor, microprocessor, memory, amplifier, filter or transmitter), a micro-machined or micro-electromechanical (MEMS) structure (such as a cantilevered accelerometer) or any other type or combination of IC elements. All die on the IC wafer 100 can be identical, or the IC wafer 100 can contain a mixture of die. The IC wafer 100 can be fabricated using any acceptable material, such as Si, GaAs or GaN.

Figure 2:
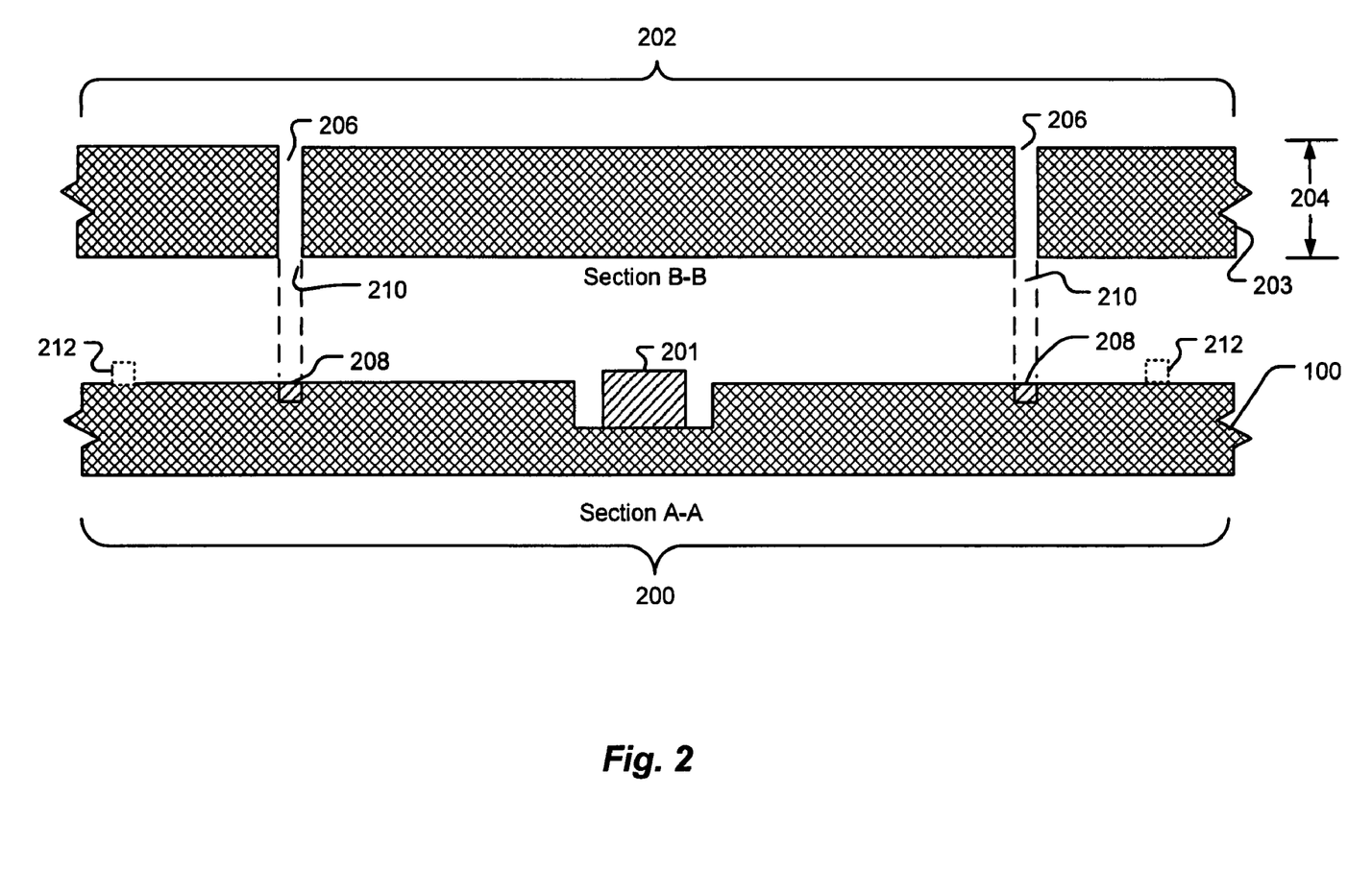
FIGS. 2-8 are cross-sectional diagrams of a wafer-level packaged IC at various intermediate stages during fabrication, in accordance with one embodiment of the present invention.

FIG. 2 illustrates a portion 200 of a cross-section through section A-A of the IC wafer 100 of FIG. 1. The portion 200 includes a single exemplary die 201 and some of the IC wafer 100 on each side of the die. The exemplary die 201 shown in FIG. 2 includes a MEMS sensor that has been fabricated on the IC wafer 100 and that is to be enclosed by a wafer-scale package. However, instead of the MEMS sensor die 201, the IC wafer 100 can contain other types of IC die. Furthermore, rather than a single die 201, the portion 200 can include a plurality of die (not shown).

Figure 1B:
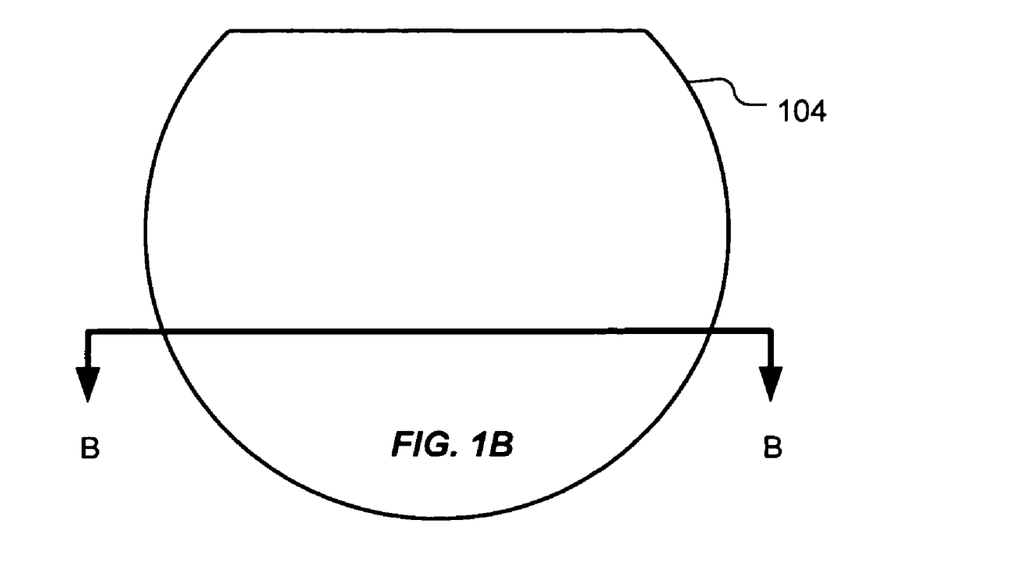
FIG. 1b is a top view diagram of a cap wafer, in accordance with one embodiment of the present invention.

FIG. 1b is a top view of a cap wafer 104. The cap wafer 104 is preferably fabricated from silicon (Si), but other suitable materials, such as GaAs or GaN are acceptable. The cap wafer 104 and the IC wafer 100 preferably have similar coefficients of thermal expansion (CTE). If the CTEs are significantly mismatched, it may be necessary to attach small caps (such as singulated portions of the cap wafer 104) to respective portions of the IC wafer 100. Alternatively, the IC wafer 100 can be singulated, and individual die 102 or groups of die can be attached to the cap wafer 104.

FIG. 2 also illustrates a portion 202 of a cross-section through section B-B of the silicon cap wafer 104 positioned above the IC wafer 100. The cap wafer 104 is shown above the IC wafer 100 in FIG. 2 to facilitate describing structures formed on the cap wafer and their relationships to features on the IC wafer, although the cap wafer is typically not suspended above the IC wafer during fabrication. The cap wafer 104 (and, in some embodiments, the IC wafer 100) includes novel features as described herein, however, the wafer(s) and these features can be fabricated and processed using well-known techniques.

The cap wafer 104 is typically approximately the same size and shape as the IC wafer 100, although the cap wafer can have a larger or smaller diameter or a different shape than the IC wafer. After fabrication, to reduce the height of the resulting package, the cap wafer 104 is preferably thinned, such as by lapping, prior to subsequent processing. Any thickness cap wafer is acceptable, as long as the cap wafer 104 and the ultimate resulting cap and package are structurally sound. The thickness 204 of the cap wafer 104 depends, in part, on the size, material, configuration, etc. of the cap wafer 104 and the ultimate resulting cap. In one embodiment, the cap wafer 104 is thinned to about 200 microns or thinner, although cap wafers thicker than 200 microns are acceptable.

Holes, such as holes 206, are formed through the cap wafer 104 in locations that correspond to wire bonding pads, electrical contact pads or the like 208 (collectively herein referred to as "contact points") on the IC wafer 100. These contact points 208 are typically associated with the sensor die 201 and are electrically connected to the die via circuitry (not shown) in various layers of the IC wafer 100. The relationships between the holes 206 in the cap wafer 104 and the contact points 208 on the IC wafer 100 are indicated by dashed lines 210. The holes 206 can be formed (referred to herein as "drilled") by any acceptable method, such as deep etching or laser drilling.

Figure 3:
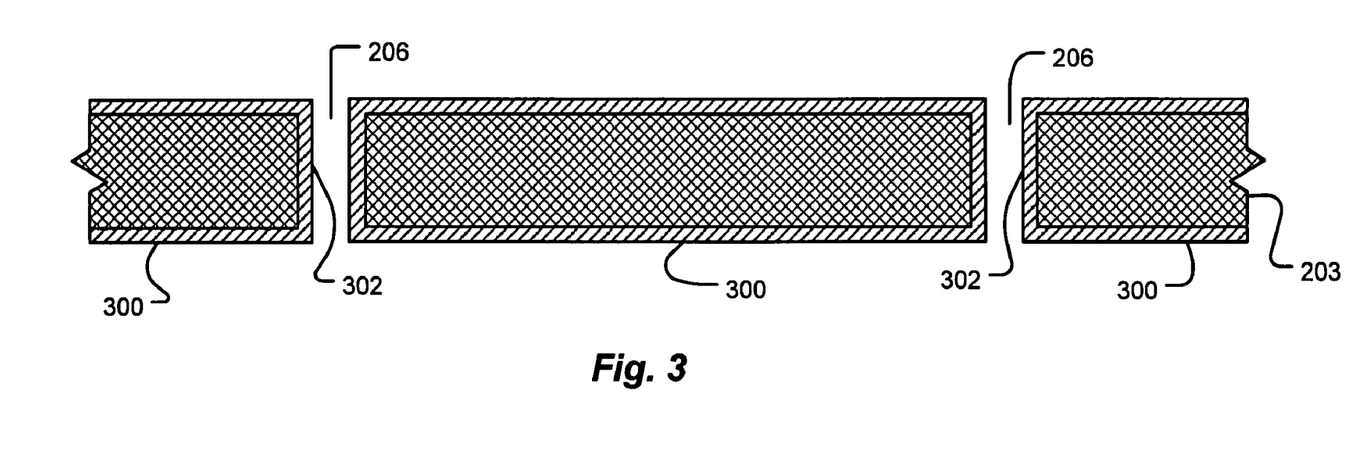

As shown in FIG. 3, an electrical insulating layer 300 is grown or deposited (herein collectively referred to as "formed") on the surface of the cap wafer 104, including on the inside walls 302 of the holes 206. The composition of the insulating layer 300 is any suitable material, such as silicon dioxide ($SiO_2$) or silicon nitride (SiN), that is compatible with the cap wafer 104. The insulating layer 300 can be grown (for example as a thermally grown oxide), deposited (such as by vapor deposition) or formed by any other acceptable method.

Figure 4:
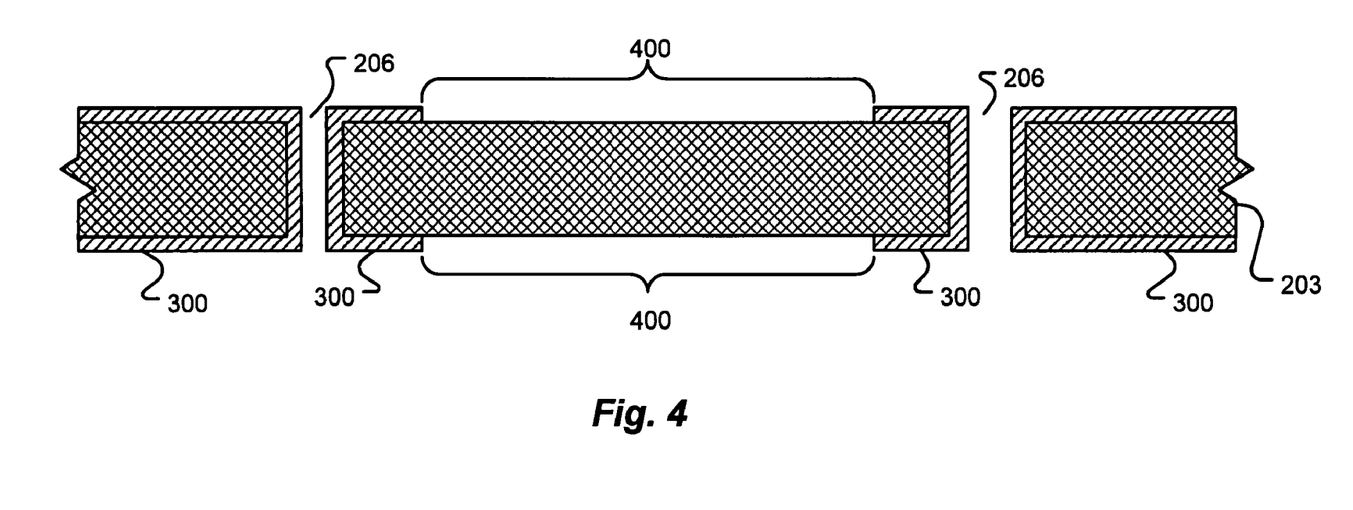
Figure 5:
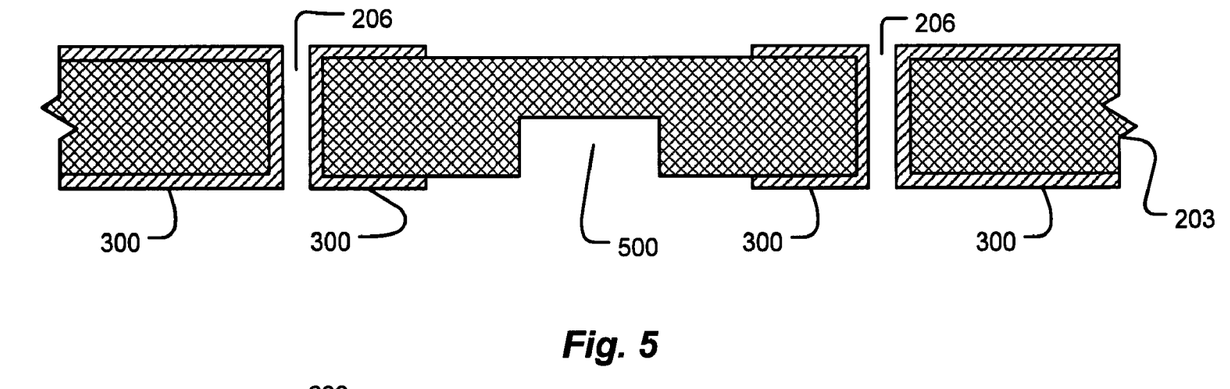

As shown in FIG. 4, portions 400 of the insulating layer 300 are removed, such as by dry or wet etching. Optionally, as shown in FIG. 5, a cavity 500 is formed in the cap wafer 104 to provide space for the sensor die 201 (FIG. 2) once the cap wafer is attached to the IC wafer 100.

Figure 6:
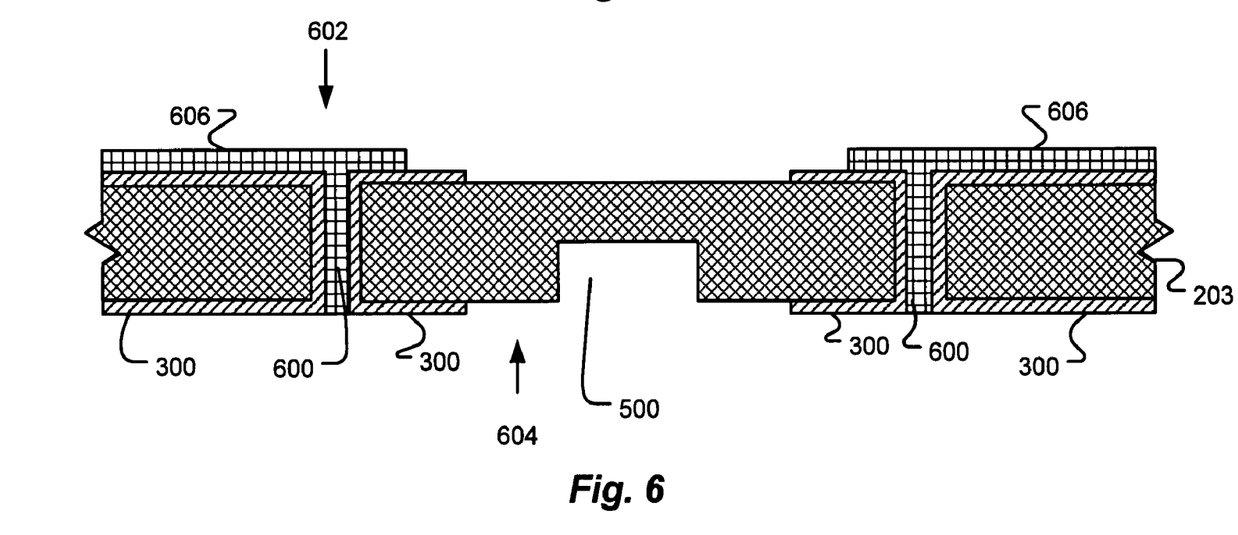

As shown in FIG. 6, the holes 206 are filled with an electrically conductive material 600. This electrically conductive material 600 extends from the front side 602 of the cap wafer 104 to the back side 604 of the cap wafer to create electrically conductive paths ("through-hole interconnects") through the cap wafer. The electrically conductive material 600 can be any suitable material, such as a gold alloy (for example gold-tin (AuSn)), another solder, a metal powder mixed with an organic solvent that is subsequently driven off ("burned away") by heat (collectively referred to herein as a "powdered metal alloy paste"), or the like. The metal can be electroplated, for example, onto the cap wafer 104. The electrically conductive material 600 preferably fills the holes 206, such that the conductive material 600 is flush with the insulating layer 300 on the back side 604 of the cap wafer 104. In addition, the electrically conductive material 600 preferably overlays a portion of the insulating layer 300 on the front side 602 of the cap wafer 104 adjacent each hole 206 to form respective wafer contact pads 606.

Optionally (not shown), some of the holes 206 are only partially filled with electrically conductive material 600 to create electrically conductive paths that extend through only a portion of the thickness of the cap wafer 104. The remainder of these holes 206 is filled with an insulative material. Such conductive paths can electrically connect circuits in the IC wafer 100 with circuits in the cap wafer 104, without reaching the front side 606 of the cap wafer 104. Alternatively, such conductive paths can electrically connect circuits in the cap wafer 104 with wafer contact pads 606, without necessarily reaching the back side 604 of the cap wafer 104.

As shown in FIG. 7, a seal ring 700 is formed, such as by printing, on the cap wafer 104 around each cavity 500. If necessary, depending on the composition of the seal ring 700, the cap wafer 104 and/or the IC wafer 100 are heated to soften, melt or activate the seal ring when the cap wafer is attached to the IC wafer. When the cap wafer 104 is attached to the IC wafer 100, as shown in FIG. 8, the seal ring 700 surrounds and seals the sensor die 201, such as against infiltration of gas or moisture between the cap and the IC wafer or to otherwise protect the sensor die. The seal ring 700 can be circular, as viewed from the top (not shown), or another shape. The seal ring 700 can surround all or a portion of the contact pads, i.e. it can follow any convenient path along the wafer. The seal ring 700 can be hermetic or non-hermetic, depending on the materials used. The seal ring 700 is made of any suitable material, such as glass, metal or metal alloy (for example gold-aluminum (AuAl), AuSn or other solder, indium-gold-tin, copper on aluminum or nickel on aluminum), and of sufficient width 702 and thickness (FIG. 7) to provide a uniform seal that complies with the topography (such as IC circuitry) on the wafer surface. Alternatively, the seal ring 700 is made of an epoxy, a suitable polymer or other material.

Generally, the speed of infiltration through the seal ring 700 depends on the material and width of the seal ring. In one embodiment, a glass seal ring 700 having a width 702 of about 100 microns provides a hermetic seal. Other widths 702 that are greater than or less than 100 microns are also acceptable. For example, a glass seal ring 700 having a width 702 of about 250 microns experiences a lower rate of infiltration than a similar seal ring having a width of about 100 microns. The amount of glass should, however, be limited, if there is a significant difference in the CTEs of the glass and of the cap or IC wafers 104 and 100. If a non-hermetic seal around the die 201 is acceptable, other materials, such as organic epoxies, can be used instead of glass or metal for the seal ring 700.

Also as shown in FIG. 7, bumps or dots 704 of solder or other suitable material (such as a conductive polymer or conductive epoxy) are placed on the back side 604 ends of the electrically conductive material 600. When the cap wafer 104 is attached to the IC wafer 100, as shown in FIG. 8, the cap wafer and/or the IC wafer are heated (if necessary, depending on the material of the bumps or dots 704) to soften or melt the bumps or dots, and the solder or other material attaches to, and makes electrical contact with, the contact points 208 on the IC wafer 200. Thus, the sensor die 201 is electrically connected to the wafer contact pads 606 and, optionally, to a die (not shown) on the cap wafer 104. After the die 201 is singulated from the IC wafer 100, the resulting IC can be mechanically attached and electrically connected to a circuit board, such as by soldering the wafer contact pads 606 to the circuit board.

The electrical connections provided by the solder bumps or dots 704 preferably also mechanically bind the cap wafer 104 to the IC wafer 100. The seal ring 700 preferably also mechanically binds the cap wafer 104 to the IC wafer 100. Optionally, instead of or in addition to the solder bumps or dots 704 and the seal ring 700, additional solder bumps or dots, glass frits, organic epoxies or other materials (not shown) are used to mechanically bind the cap wafer 104 to the IC wafer 100. Optionally, after the cap wafer 104 is attached to the IC wafer 100, the IC wafer 100 is thinned, such as by lapping, to reduce the overall thickness of the resulting IC.

The structure formed by attaching the cap wafer 104 to the IC wafer 100 (a portion of which is shown in cross-section in FIG. 8) is referred to herein as a composite wafer. As discussed in more detail below, a composite wafer can include more than two wafers in a "multi-story" structure.

As shown in FIG. 8, after the cap wafer 104 is attached to the IC wafer 100, the cap wafer and the IC wafer are cut, such as by a die saw, along dashed lines 800 between pairs of die on the IC wafer to singulate the sensor die 201 from the IC wafer 100. The resulting IC 900 is shown in cross-section in FIG. 9 and in an isometric view in FIG. 10. The IC 900 includes a base portion 904 and a cap 906. As noted, the IC 900 can then be electrically and mechanically attached to a circuit board by soldering the wafer contact pads 606 to the circuit board. Advantageously, the die 201 is electrically connected to the wafer contact pads 606 by the electrically conductive material 600, without the use of wire bonding or die bonding.

The cavity 500 provides a sealed environment for the die 201. The cap wafer 104 can be attached to the IC wafer 100 in the presence of an inert gas, dried air, another gas, a vacuum or another substance, which is then trapped within the cavity 500. Optionally, when the cap wafer 104 is attached to the IC wafer 100, some or all of the space between the cap wafer and the IC wafer is filled within organic glue or another filler.

Although the sensor die 201 is shown to be closer to the seal ring 700 than to the solder bumps or dots 704, the respective positions of the seal ring and the solder bumps or dots can be exchanged (not shown). That is, the seal ring 700 can be located outside the solder bumps or dots 704 (relative to the sensor die 201), such as near the edges 902 of the IC 900. If the cap wafer 104 and the IC wafer 100 are metalized (not shown) in portions 908 and 910 (respectively) that will become the edges, or regions near the edges, of the completed IC 900 after the cap wafer 104 and/or the IC wafer 100 is singulated, these portions 908 and 910 can be soldered together to form a mechanical connection and/or a seal along the periphery of the IC.

As noted, the cap wafer 104 and the IC wafer 100 can be fabricated according to different technologies, yielding a hybrid IC 900. For example, one embodiment of a hybrid satellite receiver IC is made from an IC wafer 100 that contains a preamplifier fabricated with gallium arsenide (GaAs) and from a cap wafer 104 that contains later-stage amplifiers fabricated with silicon (Si). The preamplifier and the later-stage amplifiers are interconnected by the solder bumps or dots 704 between the cap wafer 104 and the IC wafer 100.

When the cap wafer 104 and the IC wafer 100 are assembled, the solder bumps or dots 704 and (if necessary) the seal ring 700 are heated to soften, melt or activate the solder, glass, epoxy and/or other materials between the cap wafer and the IC wafer, and the cap wafer and the IC wafer are pressed together. Care should be exercised to maintain an appropriate gap between the cap wafer 104 and the IC wafer 100 while the solder, etc. harden. If the gap is too wide, the solder, etc. does not bond to the IC wafer 100. On the other hand, if the cap wafer 104 and the IC wafer 100 are pressed too closely together, the solder, etc. can be squeezed between the wafers and spread, such as beyond the boundaries of the contact points 208.

Spacers between the cap wafer 104 and the IC wafer 100 can be used to maintain an appropriate gap while the solder, etc. harden. In one embodiment, discrete spacers (i.e. spacers that are not part of the cap wafer or of the IC wafer) are inserted between the cap wafer 104 and the IC wafer 100 when the cap wafer and the IC wafer are assembled. After the solder, etc. harden, the spacers are removed. Alternatively, the spacers can remain in place.

Figure 11:
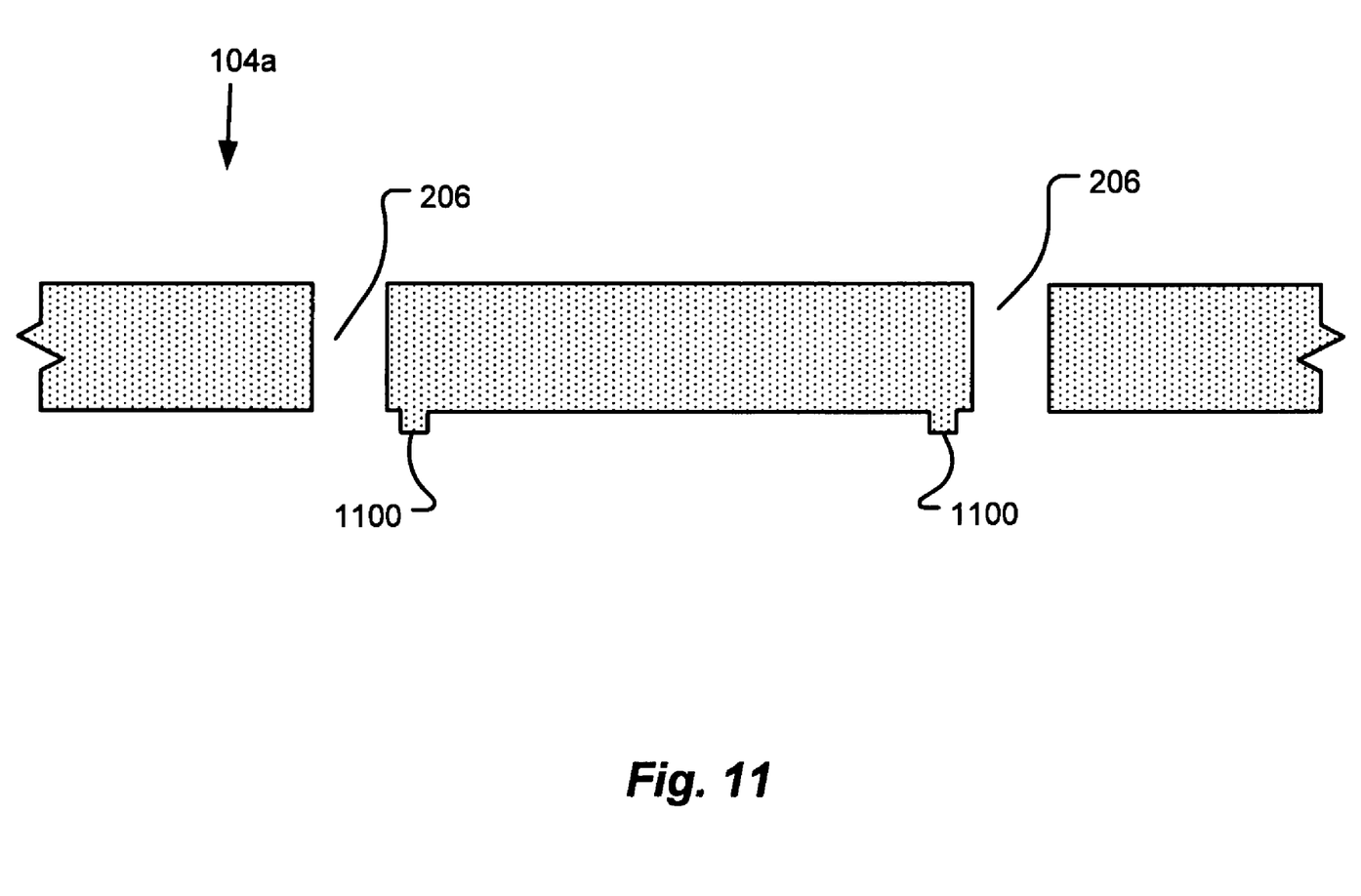
FIG. 11 is a cross-sectional diagram of a cap wafer for a wafer-level packaged IC, in accordance with another embodiment of the present invention.

In accordance with another embodiment of the present invention, rather than using discrete spacers, an alternative cap wafer 104*a* is fabricated with integrated spacers 1100 that are proud of other nearby features on the cap wafer, as shown in FIG. 11. The spacers 1100 are preferably formed before an insulating layer (not shown) is formed on the cap wafer 104*a*. The spacers 1100 are fabricated by any appropriate method, such as micro-machining, i.e. using an additional lithographic mask. (Such spacers and any insulating layers, etc. thereon are collectively hereinafter referred to simply as "spacers.") During assembly, the IC wafer 100 and the cap wafer 104*a* are brought together until the cap wafer contacts the spacers 1100. Optionally or alternatively, the IC wafer 100 can include spacers, as shown in phantom 212 in FIG. 2.

Figure 12:
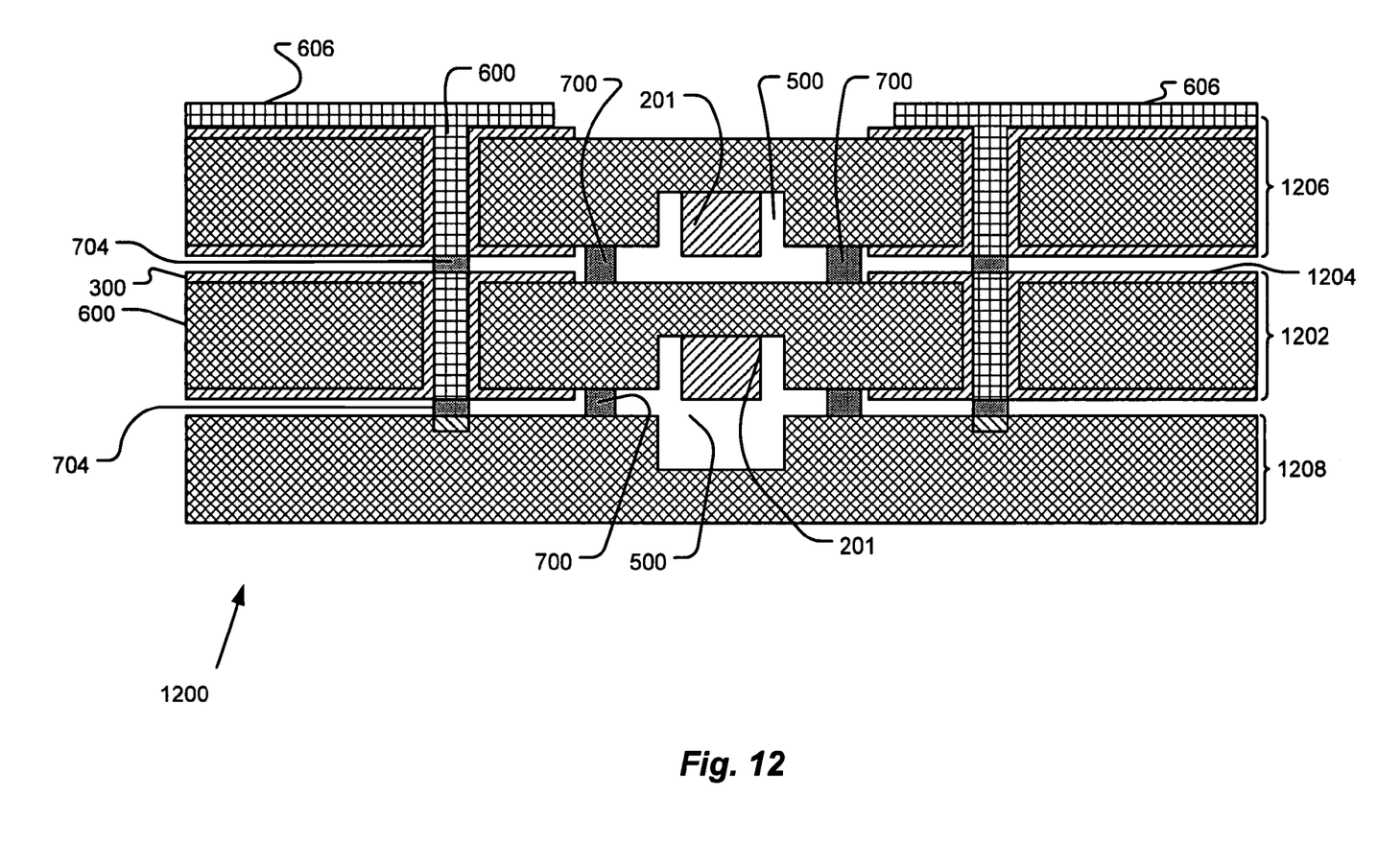
FIG. 12 is a cross-sectional diagram of a multi-story wafer-level packaged IC, in accordance with yet another embodiment of the present invention.

As noted, more than one cap wafer can be stacked on an IC wafer to make a "multi-story" IC 1200, as shown in FIG. 12. A middle layer 1202 is similar to the cap 906 shown in FIG. 9, except the middle layer need not include wafer contact pads on the insulating layer 300. Instead, the top of each electrically conductive material 600 forms a contact point on the front side 1204 of the middle layer 1202. A cap (top layer) 1206 is attached to the middle layer 1202, in the same manner as the cap 906 is attached to the base 904 in the embodiment shown in FIG. 9. As shown in FIG. 12, solder bumps or dots 704 and seal rings 700 can be used between the layers, as needed. Optionally, any of the layers 1202, 1206 or 1208 can include a cavity 500 to accommodate a die 201. The top layer 1206 includes wafer contact pads 606 for connection to a circuit board or the like. The electrically conductive paths formed by the electrically conductive material 600 can connect to one or more die, such as die 201, in any of the layers 1202, 1206 and 1208. Although the embodiment shown in FIG. 12 includes a total of three layers 1202, 1206 and 1208, other embodiments can include more or fewer layers.

Multi-story ICs can simplify the design of complex MEMS or other integrated circuit structures. For example, instead of implementing a complex three-dimensional IC design on a single wafer using a series a lithographic masks, one mask for each layer of the wafer, such a three-dimensional design can be decomposed into a series of relatively simple "stories" (wafers), and the stories can be bonded together as described above into a multi-story IC.

While the invention is described through the above-described exemplary embodiments, it will be understood by those of ordinary skill in the art that modifications to, and variations of, the illustrated embodiments may be made without departing from the inventive concepts disclosed herein. For example, although the seal ring 700 and the solder bumps or dots 704 are described as initially attached to the cap wafer 104, the seal ring and/or the solder bumps or dots can, alternatively or optionally, be initially attached to the IC wafer 100. Accordingly, the invention should not be viewed as limited, except by the scope and spirit of the appended claims.

What is claimed is:

1. A method of wafer-level packaging an integrated circuit (IC) die, comprising:

providing an IC wafer comprising a plurality of die and at least one electrical contact point associated with each die;

providing a first semiconductor cap wafer;

forming electrically conductive paths through the first semiconductor cap wafer at positions corresponding to respective ones of the electrical contact points on the IC wafer, such that each electrically conductive path extends from a first side of the first semiconductor cap wafer to a second side of the first semiconductor cap wafer and is insulated from at least a portion of the first semiconductor cap wafer; and before cutting the die from the IC wafer, attaching the first semiconductor cap wafer to the IC wafer, such that the ends of the conductive paths on the first side of the first semiconductor cap wafer are electrically connected to the respective electrical contact points on the IC wafer.

2. The method of claim 1, wherein forming each electrically conductive path comprises:

drilling a hole through the first semiconductor cap wafer;

forming an insulating layer on the inside wall of the drilled hole, thereby defining an insulated passage through the first semiconductor cap wafer; and filling the insulated passage with an electrically conductive material.

3. The method of claim 2, wherein forming the insulating layer on the inside wall of the drilled hole comprises thermally growing the insulating layer.

4. The method of claim 2, wherein forming the insulating layer on the inside wall of the drilled hole comprises thermally growing a layer of SiO2 or SIN.

5. The method of claim 2, wherein forming the insulating layer on the inside wall of the drilled hole comprises vapor depositing the insulating layer.

6. The method of claim 2, wherein filling each insulated passage comprises:

pressing a mixture of powdered metal alloy paste containing an organic solvent into the insulated passage; and subsequently burning away the organic solvent and leaving a hardened metal alloy.

7. The method of claim 2, wherein filling each insulated passage comprises filling the insulated passage with metal.

8. The method of claim 2, wherein filling each insulated passage comprises electroplating the insulated passage with metal.

9. The method of claim 2, wherein filling each insulated passage comprises filling the insulated passage with solder.

10. The method of claim 2, wherein filling each insulated passage comprises filling the insulated passage with AuSn.

11. The method of claim 2, wherein forming each insulated electrically conductive path further comprises:
  forming an insulating layer on at least a portion of the second side of the first semiconductor cap wafer adjacent the drilled hole; and
  forming an electrically conductive package contact pad on at least a portion of the insulating layer and in contact with one end of the electrically conductive material in the insulated passage.

12. The method of claim 2, wherein drilling the hole through the first semiconductor cap wafer comprises etching the hole.

13. The method of claim 2, wherein drilling the hole through the first semiconductor cap wafer comprises laser drilling the hole.

14. The method of claim 1, wherein providing the first semiconductor cap wafer comprises forming a spacer on the first side of the first semiconductor cap wafer.

15. The method of claim 1, wherein providing the IC wafer comprises forming a spacer on the IC wafer.

16. The method of claim 1, wherein providing the first semiconductor cap wafer comprises forming at least one cavity in the first side of the first semiconductor cap wafer.

17. The method of claim 1, wherein attaching the first semiconductor cap wafer to the IC wafer comprises sealing each of at least some of the die against infiltration through a gap between the IC wafer and the first semiconductor cap wafer.

18. The method of claim 17, wherein sealing the die comprises forming a glass frit on the cap wafer or on the IC wafer.

19. The method of claim 17, wherein sealing the die comprises forming a metal seal on the cap wafer or on the IC wafer.

20. The method of claim 1, further comprising thinning the first semiconductor cap wafer.

21. The method of claim 20, wherein thinning the first semiconductor cap water comprises lapping the first semiconductor cap wafer.

22. The method of claim 1, further comprising thinning the IC wafer.

23. The method of claim 22, wherein thinning the IC wafer comprises lapping the IC wafer.

24. The method of claim 1, further comprising dividing the first semiconductor cap wafer into a plurality of IC caps by cutting the first semiconductor cap wafer between pairs of the plurality of die.

25. The method of claim 24, further comprising singulating at least some of the die by cutting the die from the IC wafer.

26. The method of claim 1, wherein providing the IC wafer comprises providing an IC wafer fabricated of a material other than silicon.

27. The method of claim 1, wherein providing the IC wafer comprises providing an IC wafer fabricated of GaAs.

28. The method of claim 1, wherein providing the first semiconductor cap wafer comprises providing a cap wafer fabricated of Si.

29. The method of claim 1, wherein providing the first semiconductor cap wafer comprises providing a cap wafer fabricated of GaAs.

30. The method of claim 1, wherein providing the first semiconductor cap wafer comprises providing a cap wafer fabricated of GaN.

31. The method of claim 1, further comprising:
  providing a second semiconductor cap wafer;
  forming electrically conductive paths through the second semiconductor cap wafer at positions corresponding to respective ones of the electrically conductive paths through the first silicon wafer, such that each electrically conductive path through the second silicon wafer extends from a first side of the second semiconductor cap wafer to a second side of the second semiconductor cap wafer and is insulated from at least a portion of the second semiconductor cap wafer; and
  before cutting the die from the IC wafer, attaching the second semiconductor cap wafer to the first semiconductor cap wafer, such that the ends of the conductive paths on the first side of the second semiconductor cap wafer are electrically connected to the respective electrically conductive paths through the first semiconductor cap wafer.

32. The method of claim 31, wherein forming each electrically conductive path comprises:
  drilling a hole through the respective semiconductor cap wafer;
  forming an insulating layer on the inside wall of the drilled hole, thereby defining an insulated passage through the respective semiconductor cap wafer; and
  filling the insulated passage with an electrically conductive material.

33. The method of claim 32, wherein forming each insulated electrically conductive path on the second semiconductor cap wafer further comprises:
  forming an insulating layer on at least a portion of the second side of the second semiconductor cap wafer adjacent the drilled hole; and
  forming an electrically conductive package contact pad on at least a portion of the insulating layer and in contact with one end of the electrically conductive material in the insulated passage.

* * * * *